(12) United States Patent
Ghosh et al.

(10) Patent No.: US 6,706,226 B2
(45) Date of Patent: Mar. 16, 2004

(54) COMPACTING MOISTURE-SENSITIVE ORGANIC MATERIALS IN MAKING AN ORGANIC LIGHT-EMITTING DEVICE

(75) Inventors: Syamal K. Ghosh, Rochester, NY (US); Donn B. Carlton, Hamlin, NY (US); Tukaram K. Hatwar, Penfield, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/195,947

(22) Filed: Jul. 16, 2002

(65) Prior Publication Data
US 2004/0012120 A1 Jan. 22, 2004

(51) Int. Cl.[7] .......................... B29B 11/14; B29B 13/06
(52) U.S. Cl. ....................... 264/113; 264/109; 264/122; 264/123
(58) Field of Search ................... 264/109–122

(56) References Cited

U.S. PATENT DOCUMENTS

| | | | |
|---|---|---|---|
| 4,356,429 A | | 10/1982 | Tang |
| 4,447,565 A | * | 5/1984 | Lula et al. .................. 523/219 |
| 4,539,507 A | | 9/1985 | VanSlyke et al. |
| 4,769,292 A | | 9/1988 | Tang et al. |
| 5,550,066 A | | 8/1996 | Tang et al. |
| 5,593,788 A | | 1/1997 | Shi et al. |
| 5,645,948 A | | 7/1997 | Shi et al. |
| 5,885,493 A | * | 3/1999 | Janney et al. ............. 264/37.18 |
| 6,020,078 A | | 2/2000 | Chen et al. |

FOREIGN PATENT DOCUMENTS

| | | |
|---|---|---|
| JP | 02-042421 | 2/1990 |
| JP | 11-092915 | 4/1999 |
| JP | 2000-252061 | 9/2000 |

OTHER PUBLICATIONS

O'Brien et al, Improved energy transfer in electrophosphorescent devices, Appl. Phys. Letters vol. 74, No. 3, Jan. 18, 1999, pp. 442–444.

Lamansky et al, Highly Phosphorescent Bis–Cyclometalated Iridium Complexes: Synthesis, Photophysical Characterization, and Use in Organic Light Emitting Diodes, J. Am Chem Soc. 2001, 4304–4312.

* cited by examiner

Primary Examiner—Stephen J. Lechert, Jr.
(74) Attorney, Agent, or Firm—Raymond L. Owens

(57) ABSTRACT

A method of compacting moisture-sensitive organic material adaptable for making an organic layer on a structure which will form part of an organic light-emitting device, includes placing such a desiccant material in a powder form inside a die cavity and applying a pressure to such a desiccant powder in the die cavity sufficient to compact into a porous desiccant bed; providing moisture-sensitive organic material in a powder form; and placing such moisture-sensitive organic material inside the die cavity over the porous desiccant bed, and applying sufficient heat to the moisture-sensitive organic material in the die cavity to cause moisture to escape from the moisture-sensitive organic material and be absorbed by the porous desiccant bed, and then applying sufficient pressure to compact the moisture-sensitive organic material into a solid organic pellet.

27 Claims, 8 Drawing Sheets

COMPACTING MOISTURE-SENSITIVE ORGANIC MATERIALS IN MAKING AN ORGANIC LIGHT-EMITTING DEVICE

CROSS REFERENCE TO RELATED APPLICATIONS

Reference is made to commonly assigned U.S. patent application Ser. No. 09/898,369 filed Jul. 3, 2001 entitled "Method of Compacting Organic Material in Making An Organic Light-Emitting Device" by Van Slyke et al; and U.S. patent application Ser. No. 10/073,690 filed Feb. 11, 2002, entitled "Using Organic Materials in Making An Organic Light-Emitting Device" by Syamal K. Ghosh et al, the teachings of which are incorporated herein.

FIELD OF THE INVENTION

The present invention relates generally to an improved method of forming compacted pellets from powders comprising moisture-sensitive organic materials wherein moisture is removed from such powder and using such pellets in physical vapor deposition to make an organic layer on a structure which will form part of an OLED.

BACKGROUND OF THE INVENTION

An organic light-emitting device (OLED), also referred to as an organic electroluminescent device, can be constructed by sandwiching two or more organic layers between first and second electrodes.

In a passive-matrix OLED of conventional construction, a plurality of laterally spaced light-transmissive anodes, for example indium-tin-oxide (ITO) anodes, are formed as first electrodes on a light-transmissive substrate such as, for example, a glass substrate. Two or more organic layers are then formed successively by physical vapor deposition of respective organic materials from respective sources, within a chamber held at reduced pressure, typically less than $10^{-3}$ Torr. A plurality of laterally spaced cathodes is deposited as second electrodes over an uppermost one of the organic layers. The cathodes are oriented at an angle, typically at a right angle, with respect to the anodes.

Such conventional passive-matrix OLEDs are operated by applying an electrical potential (also referred to as a drive voltage) between appropriate columns (anodes) and, sequentially, each row (cathode). When a cathode is biased negatively with respect to an anode, light is emitted from a pixel defined by an overlap area of the cathode and the anode, and emitted light reaches an observer through the anode and the substrate.

In an active-matrix OLED, an array of anodes are provided as first electrodes by thin-film transistors (TFTs) which are connected to a respective light-transmissive portion. Two or more organic layers are formed successively by vapor deposition in a manner substantially equivalent to the construction of the aforementioned passive matrix device. A common cathode is deposited as a second electrode over an uppermost one of the organic layers. The construction and function of an active matrix organic light-emitting device is described in commonly-assigned U.S. Pat. No. 5,550,066, the disclosure of which is herein incorporated by reference.

Organic materials, thicknesses of vapor-deposited organic layers, and layer configurations, useful in constructing an organic light-emitting device, are described, for example, in commonly-assigned U.S. Pat. Nos. 4,356,429; 4,539,507; 4,720,432; and 4,769,292, the disclosures of which are herein incorporated by reference.

Organic materials useful in making OLEDs, for example organic hole-transporting materials, organic light-emitting materials predoped with an organic dopant, and organic electron-transporting materials can have relatively complex molecular structures with relatively weak molecular bonding forces, so that care must be taken to avoid decomposition of the organic material(s) during physical vapor deposition.

The aforementioned organic materials are synthesized to a relatively high degree of purity, and are provided in the form of powders, flakes, or granules. Such powders or flakes have been used heretofore for placement into a physical vapor deposition source wherein heat is applied for forming a vapor by sublimation or vaporization of the organic material, the vapor condensing on a structure to provide an organic layer thereon.

Several problems have been observed in using organic powders, flakes, or granules in physical vapor deposition:

(i) powders, flakes, or granules are difficult to handle because they can acquire electrostatic charges via a process referred to as triboelectric charging;

(ii) powders, flakes, or granules of organic materials generally have a relatively low physical density (expressed in terms of weight per unit volume) in a range from about 0.05 to about 0.2 g/cm$^3$, compared to a physical density of an idealized solid organic material of about 1 g/cm$^3$;

(iii) powders, flakes, or granules of organic materials have an undesirably low thermal conductivity, particularly when placed in a physical vapor deposition source which is disposed in a chamber evacuated to a reduced pressure as low as $10^{-6}$ Torr. Consequently, powder particles, flakes, or granules are heated only by radiative heating from a heated source, and by conductive heating of particles or flakes directly in contact with heated surfaces of the source. Powder particles, flakes, or granules which are not in contact with heated surfaces of the source are not effectively heated by conductive heating due to a relatively low particle-to-particle contact area; and (iv) powders, flakes, or granules can have a relatively high ratio of surface area/volume of such particles and a correspondingly high propensity to entrap air and/or moisture between particles under ambient conditions. Consequently, a charge of organic powders, flakes, or granules loaded into a physical vapor deposition source which is disposed in a chamber must be thoroughly outgased by preheating the source once the chamber has been evacuated to a reduced pressure. If outgasing is omitted or is incomplete, particles can be ejected from the source together with a vapor stream during physical vapor-depositing an organic layer on a structure. An OLED, having multiple organic layers, can be or can become functionally inoperative if such layers include particles or particulates.

Each one, or a combination, of the aforementioned aspects of organic powders, flakes, or granules can lead to nonuniform heating of such organic materials in physical vapor deposition sources with attendant spatially nonuniform sublimation or vaporization of organic material and can, therefore, result in potentially nonuniform vapor-deposited organic layers formed on a structure.

SUMMARY OF THE INVENTION

It is an object of the present invention to provide a method of compacting moisture-sensitive organic material adaptable for making an organic layer on a structure which will form part of OLED.

It is another object of the present invention to provide a method of compacting moisture-sensitive organic powder into a solid pellet.

It is a further object of the invention to provide a method of making an organic layer from a consolidated pellet of organic material and on a structure which will form part of an OLED.

In one aspect, the present invention provides an improved method of compacting moisture-sensitive organic material adaptable for making an organic layer on a structure, which will form part of an organic light-emitting device, comprising the steps of:

(a) placing such a desiccant material in a powder form inside a die cavity and applying a pressure to such a desiccant powder in the die cavity sufficient to compact into a porous desiccant bed;

(b) providing moisture-sensitive organic material in a powder form; and (c) placing such moisture-sensitive organic material inside the die cavity over the porous desiccant bed, and applying sufficient heat to the moisture-sensitive organic material in the die cavity to cause moisture to escape from the moisture-sensitive organic material and be absorbed by the porous desiccant bed, and then applying sufficient pressure to compact the moisture-sensitive organic material into a solid organic pellet.

In another aspect, the present invention provides a method of compacting moisture-sensitive organic material adaptable for making an organic layer on a structure, which will form part of an organic light-emitting device, comprising the steps of:

(a) providing a desiccant material in a powder form;

(b) placing a first load of desiccant powder inside a die cavity over a second punch and moving a first punch to apply pressure to such desiccant powder in the die cavity to compact into a first porous desiccant bed;

(c) placing moisture-sensitive organic material in a powder form inside the die cavity over the first porous desiccant bed, and applying sufficient pressure with the first punch to level the top surface of the moisture-sensitive organic material;

(d) placing a second load of desiccant powder over the level surface of moisture-sensitive organic material and apply sufficient pressure with the first punch to form a second porous desiccant bed; and (e) applying sufficient heat to the moisture-sensitive organic material inside the die cavity to cause moisture to escape from the moisture-sensitive organic material and be absorbed by the first and second porous desiccant beds, and then applying sufficient pressure to compact the moisture-sensitive organic material into a solid organic pellet.

Another feature of the method described above is providing a porous punch with means to pass dry inert gas through the organic material in powder form placed inside the die cavity.

In another aspect, the present invention provides a method of making an organic layer from an organic material on a structure, which will form part of an OLED comprising the steps of:

(a) providing a moisture-free solid organic pellet comprising at least one organic host and one organic dopant;

(b) placing such an organic solid pellet inside a heating source disposed in a physical vapor deposition chamber;

(c) positioning the substrate in the chamber and in a spaced relationship with respect to the heating source;

(d) evacuating the chamber to a reduced pressure; and (e) applying heat to the source to cause at least a portion of the solid organic pellet to sublime to provide a vapor of the organic materials which form the organic layer on the substrate Another feature of the present invention is that a solid organic pellet can be compacted by the method of the invention wherein at least one organic host material and at least one organic dopant materials are mixed prior to the compaction process.

A feature of the present invention is that the method of compacting moisture-sensitive organic powder into a moisture-free solid pellet can be accomplished with relatively simple tools and at a location remote from a location of use of such pellet in a physical vapor deposition apparatus.

Another feature of the present invention is that the OLED displays made from using moisture-free organic pellets have better electro-optical performance.

Another feature of the present invention is that the method of compacting organic powder into a solid pellet substantially facilitates transfer or shipping of organic material in and between different locations.

Another feature of the present invention is that a plurality of pellets of organic material, prepared by the method of the present invention, can be handled, transferred or shipped in a container having a significantly reduced volume with respect to a container for compacting, transferring or shipping organic material in powder form and of comparable weight.

Another feature of the present invention is that a consolidated pellet of an OLED-material can be made by the method of the present invention wherein a powder of at least one OLED host-material and a powder of at least one organic dopant material are mixed or blended to provide a mixture prior to compacting the mixture into a consolidated pellet.

Another feature of the present invention is that a solid organic pellet comprising a host and one or more organic dopants eliminates the need of co-evaporation which require more than one evaporation source disposed inside a vacuum chamber.

BRIEF DESCRIPTION OF THE DRAWINGS

FIGS. 3A–3D are cross-sectional views of the compacted solid organic pellets according to different features of the invention, wherein:

FIG. 3A shows the solid organic pellet compacted over porous desiccant bed;

FIG. 3B shows the solid organic pellet is sandwiched between two porous desiccant beds;

FIG. 3C shows a separator placed between the solid organic pellet and the porous desiccant bed;

FIG. 3D shows the same configuration as in FIG. 3B having separators placed between compacted layers;

The term "powder" is used herein to denote a quantity of individual particles, which can be flakes, granules, or mixtures of varied particles and shapes comprising single or plurality of molecular species.

DETAILED DESCRIPTION OF THE INVENTION

Figure 1:
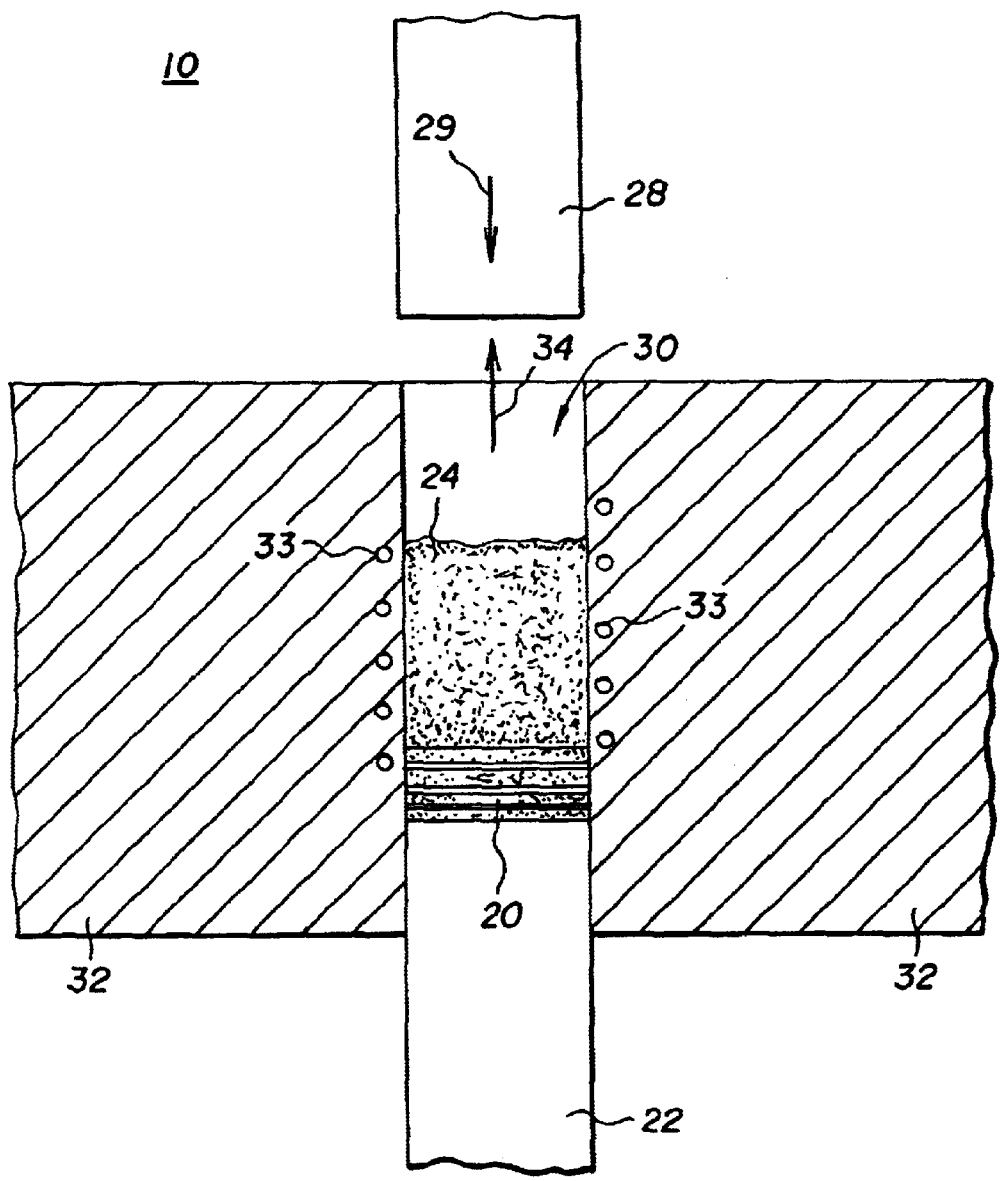
FIG. 1 is a schematic representation of the process step of the invention having organic powder disposed over a porous desiccant bed.

The organic layers of an OLED include an organic or organo-metallic material that produces light, known as electroluminescence (EL), as a result of electron-hole recombination in the layer. Hereinafter, the term "organic" will be taken to include both purely organic as well as organo-metallic materials. Turning to FIG. 1, a schematic perspective of a compaction arrangement 10 is shown wherein moisture-sensitive organic materials can be compacted for the purpose of evaporation of OLED organic layers. A known amount of desiccant powder is placed inside a die cavity 30 and compacted using a first (upper) punch 28 to form a porous desiccant bed 20. The porous desiccant bed 20 is then placed on a second (lower) punch 22 which is disposed inside a die cavity 30 of a die 32. A known amount of moisture-sensitive organic powder 24 is then placed inside the die cavity 30 over the porous desiccant bed 20 which is deployed as a getter for the adsorbed moisture in the organic powder 24. The organic powder 24 can be composed of a single organic molecule or can be a mixture of plurality of organic molecules. The die 32 is then heated by energizing a heating coil 33 at a temperature well below Tg (the lowest Tg if the organic powder 24 is a mixture of plurality of molecules) of the organic powder 24 in order for any trapped or adsorbed moisture to escape from the open cavity as shown by a moisture escape arrow 34, and the moisture which could not escape from the open die cavity 30 is absorbed by the porous desiccant bed 20. After the die 32 is heated to the set temperature and made sure that enough time has elapsed for the trapped moisture to escape, the first punch 28 was plunged into the die cavity 30 in a first direction 29 and a known amount of pressure between 2,000 and 8,00 psi was applied to the organic powder 24 to complete the compaction process. A preferred range of pressure is from 4,000 to 6,000 psi.

The porous desiccant bed 20 is made from alkaline earth oxides, such as calcium oxide, magnesium oxide, strontium oxide or barium oxide or a mixture thereof. The desiccant powder is compacted such that the porous desiccant bed 20 has porosity ranging from 40 to 80 per cent without compromising the physical integrity of the porous desiccant bed 20 for ease of compacting. Higher degree of porosity and smaller size particles in the porous desiccant bed 20 help trap a greater amount of moisture.

Figure 2:
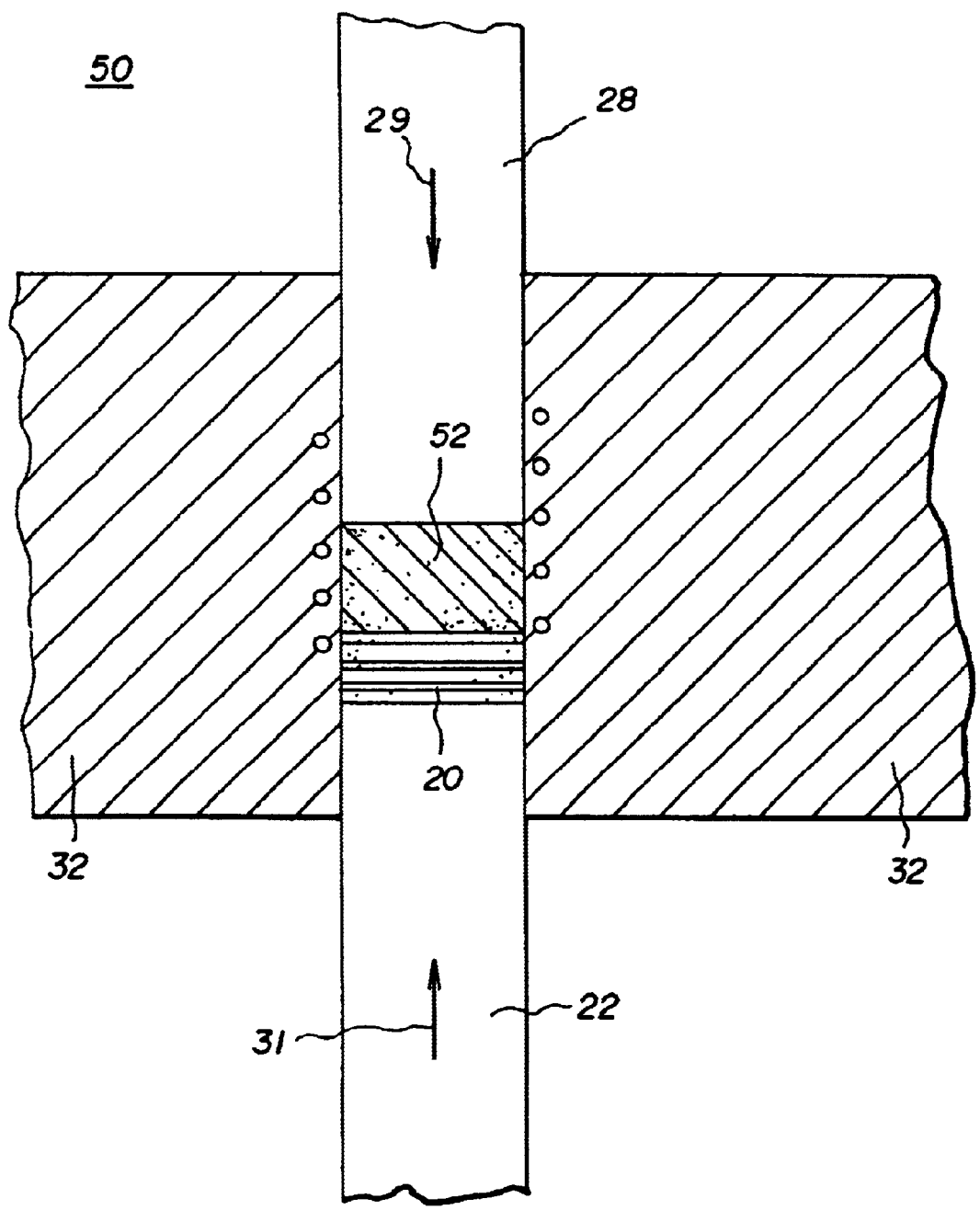
FIG. 2 shows the final step of the process shown in FIG. 1 after consolidation of organic powder.
Figure 3A:
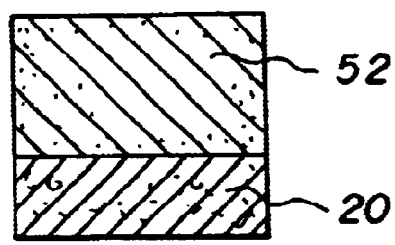

Turning to FIG. 2 there is shown the final sequence of compaction arrangement 50 wherein the compaction step is just completed and the compacted solid organic pellet 52 is disposed over the porous desiccant bed 20 inside the die cavity 30 of the die 32. The die 32 is then allowed to cool to room temperature and the compacted solid organic pellet 52 and porous desiccant bed 20 respectively held together are taken out of the die 32 using the second punch 22 which is moved in a second direction 31 which is opposite to the first direction 29 as shown in FIG. 2. The solid organic pellet 52 is gently sheared off from the porous desiccant bed 20. A cross-sectional view of the solid organic pellet 52 and porous desiccant bed 20 after that are removed from the die cavity and prior to separation is shown in FIG. 3A. Sometimes it is also very useful to place a piece of porous paper like filter paper or rice paper between the desiccant bed 20 and the organic powder 24 (See FIG. 1) prior to the compaction process to aid in separating two pellets.

Figure 3B:
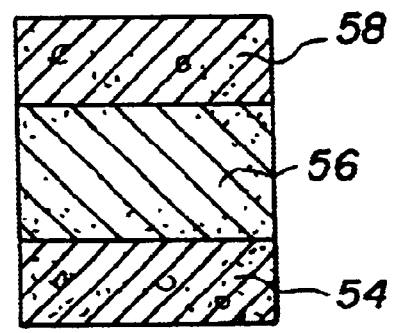
Figure 3C:
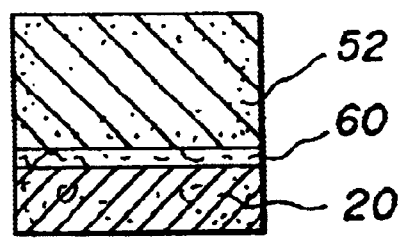
Figure 3D:
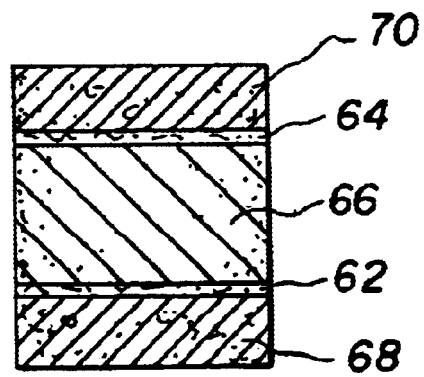

Turning to FIGS. 3A–3D, there are shown solid organic pellets obtained by compaction processes according to different embodiments of the invention. FIG. 3B is a cross-sectional view of a solid organic pellet 56 sandwiched between a first porous desiccant bed 54 and a second porous desiccant bed 58, which is obtained by two separate compaction processes. The first compaction process can be accomplished as follows: forming the first porous desiccant bed 54 by applying a first load of desiccant powder over the second punch 22, and applying pressure by the first punch 28. The second compaction process is accomplished by placing a second load of desiccant powder over organic material placed on the first porous desiccant bed 54, Thereafter pressure is applied by the first punch 28, for example between 100 and 500 psi, so that the organic powder is not yet compacted; adding the second load of desiccant powder over the surface of the organic powder and applying pressure to form the second desiccant bed 58. Thereafter the heating coils are energized to heat the organic powder and then sufficient pressure is applied to complete the compaction process. The compacted solid organic pellet 56 sandwiched between the first porous desiccant bed 54 and the second porous desiccant bed 58 are removed from the die cavity and the desiccant porous beds 54, 58 are gently cleaved off from the solid organic pellet 56. It may also be very useful to place porous paper 60, for example filter paper or rice paper, between the solid organic pellet 52 and the porous desiccant bed 20 as illustrated in FIG. 3C for ease of separation. Similarly, FIG. 3D shows the cross-sectional view of a compacted solid organic pellet 66 which is sandwiched between two porous desiccant beds 68 and 70 respectively, and porous papers 62, 64 are placed between the solid organic pellet 66 and the porous desiccant beds 68 and 70 for ease of separation.

The organic pellet 52 (see FIG. 3A) is made from organic powder which includes a single or a plurality of different organic or organo-metallic molecules. As for example, the emission layer can be a single molecule organic material having a high luminescent efficiency. A well-known material for this purpose is tris(8-quinolinolato-N1,08)aluminum (Alq), which produces excellent green electroluminescence. The emission layer can also contain lesser amounts of other materials, hereinafter termed luminescent dopants, whose function is to alter the EL efficiency or the color of the emitted light.

The choice of host material for the emission layer depends, in part, on the desired emission color and/or the choice of any luminescent dopant to be used in that layer. Host materials comprising metal complexes with derivatives of 8-hydroxyquinolate, such as Alq, are useful when dyes of the coumarin or quinacridone class are used as luminescent dopants for green emission or derivatives DCM are used as luminescent dopants for red emission. A preferred green-emitting coumarin is C545T as described by Tang et al. in commonly-assigned U.S. Pat. No. 6,020,078. A preferred green-emitting quinacridone is CFDMQA as described by Shi et al. in commonly-assigned U.S. Pat. No. 5,593,788. A preferred red-emitting dye, which is a derivative of DCM, is DCJTB. The structures of DCM and DCJTB are shown below.

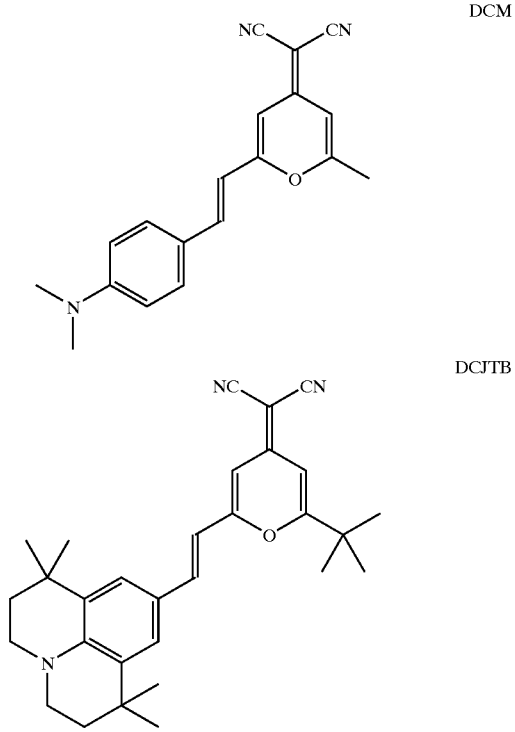

Other materials can be used as luminescent dopants, including phosphorescent compounds such as the platinum complex described by O'Brien et al., Applied Physics Letters, Vol. 74, pp. 442–444, 1999 or the iridium compounds described by Lamansky et al., Journal of the American Chemical Society, Vol. 123, pp. 4304–4312, 2001. The quantity of a luminescent dopant in an emission layer is usually between 0.01 and 10% and preferably between 0.5 and 2%. Hereinafter, the percentage of a luminescent dopant or a color-neutral dopant in a composition means a percentage by volume with respect to the total composition Materials useful in the emission-transport layer of this invention include metal complexes with the 8-hydroxyquinolate anion, such as those described above, as disclosed in commonly-assigned U.S. Pat. No. 4,885,211. Such materials both exhibit high levels of performance and are readily fabricated in thin layers. They can be used as the sole material of an undoped electron-transport layer or an undoped sublayer of an electron-transport layer. They can also be used as the host material in a doped electron-transport layer or a doped sublayer of an electron-transport layer. Materials of this class are currently preferred. Most preferred is Alq. Other materials known in the art can be used in the electron-transport layer of this invention. An example is TPBI, described in commonly-assigned U.S. Pat. No. 5,645,948 by Shi et al. If a transparent cathode is used, it is preferred to use materials in the electron-transport layer that is also transparent.

Materials useful in the hole-transport layer of this invention include tertiary amines as taught in Van Slyke in commonly-assigned U.S. Pat. No. 4,539,507. They can be used as the sole material of an undoped hole-transport layer or an undoped sublayer of a hole-transport layer. They can also be used as the host material in a doped hole-transport layer or a doped sublayer of a hole-transport layer. Materials of this class are currently preferred. Most preferred is NPB, namely 4,4'-Bis[N-(1-napthyl)-N-phenylamino]biphenyl as described by Van Slyke et al. in commonly-assigned U.S. Pat. No. 4,539,507.

Host materials for the blue emission layer are 9,10-diphenylanthracene, 9,10-bis[4-(2,2-diphenylethenyl) phenyl]anthracene, AND, and TBADN. The structures of AND and TBADN are shown below.

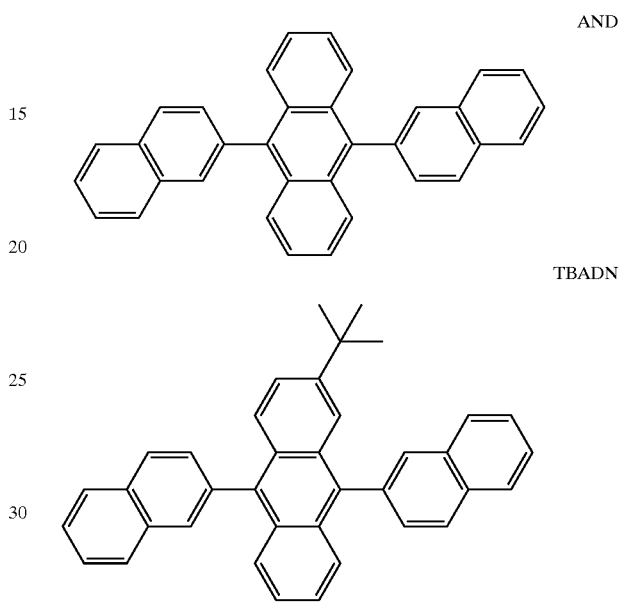

Figure 4:
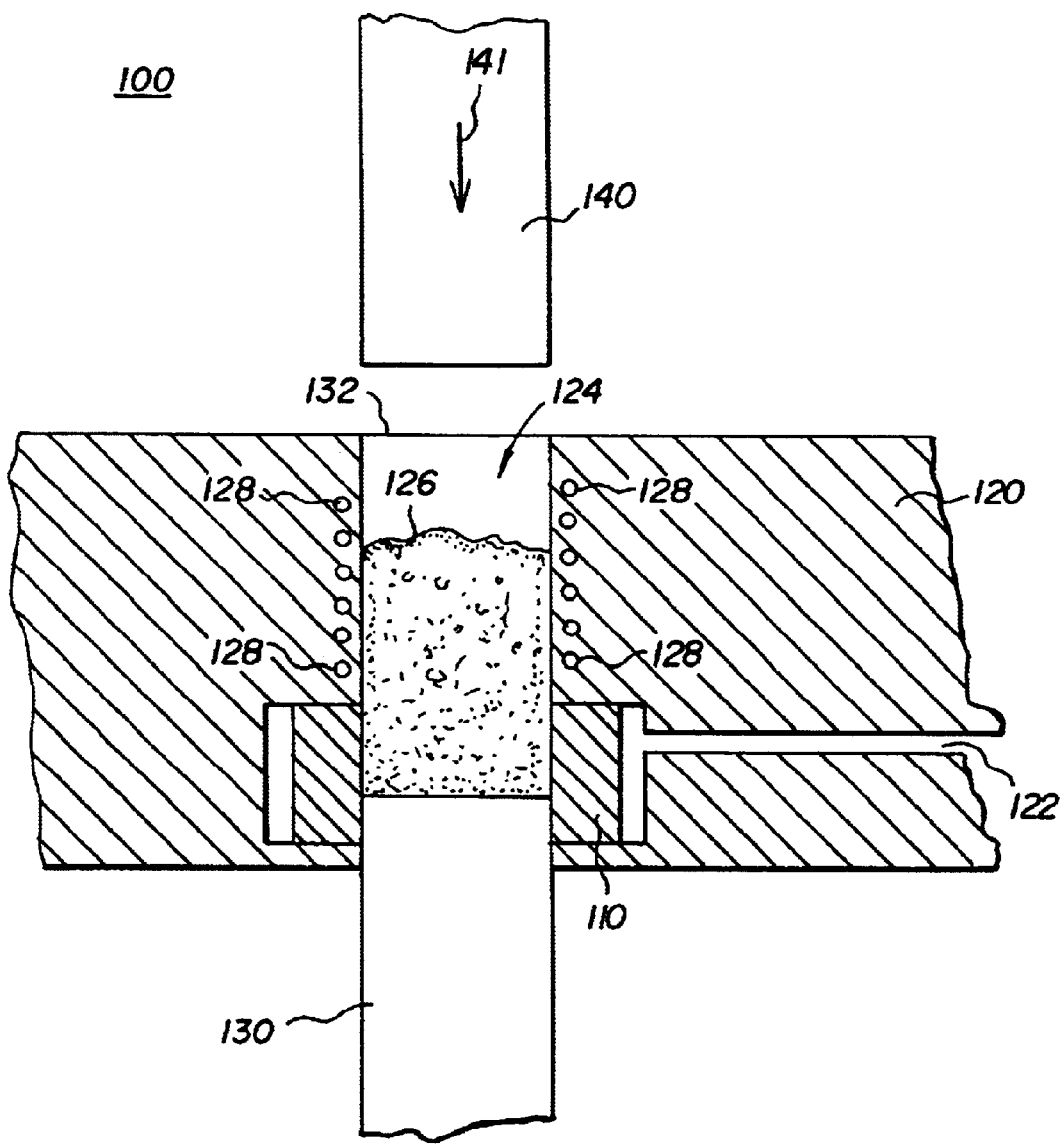
FIG. 4 is a cross-sectional view of an alternative embodiment of the process step of the invention.

Turning to FIG. 4, there is shown a schematic compaction arrangement 100 as an alternative embodiment of the invention. In this alternative process a desiccant material is not used to scavenge the adsorbed moisture from the moisture-sensitive organic materials. Alternatively, a steady stream of inert dry gas like nitrogen or argon is passed through heated organic powder 126. The dry inert gas is introduced through an inlet channel 122 located inside the die 120, wherein the channel 122 is connected to a porous receptor 110 which allows the inlet gas to seep into the die cavity 124. The porous receptor 110 can be made from metals like stainless steel or aluminum or ceramics like alumina and zirconia. Initially, a second (lower) punch 130 is placed inside the die cavity 124 in close proximity to the porous receptor 110. A known amount of organic powder 126 is placed inside the die cavity 124 and a heating coil 128 is energized to heat the organic powder 126 to a specific temperature. A stream of pre-heated or ambient dry nitrogen or dry argon gas is passed through the organic powder 126 for a sufficient length of time so that all adsorbed moisture in the organic powder 126 is removed by the gas molecules through an opening 132 located at the top of the die cavity 124. A first (upper) punch 140 is then plunged inside the die cavity 124 in a first direction 141 in contact with the organic powder 126 and sufficient pressure is applied to cause the organic powder 126 to consolidate in to a solid organic pellet 250 as shown in FIG. 5.

Figure 5:
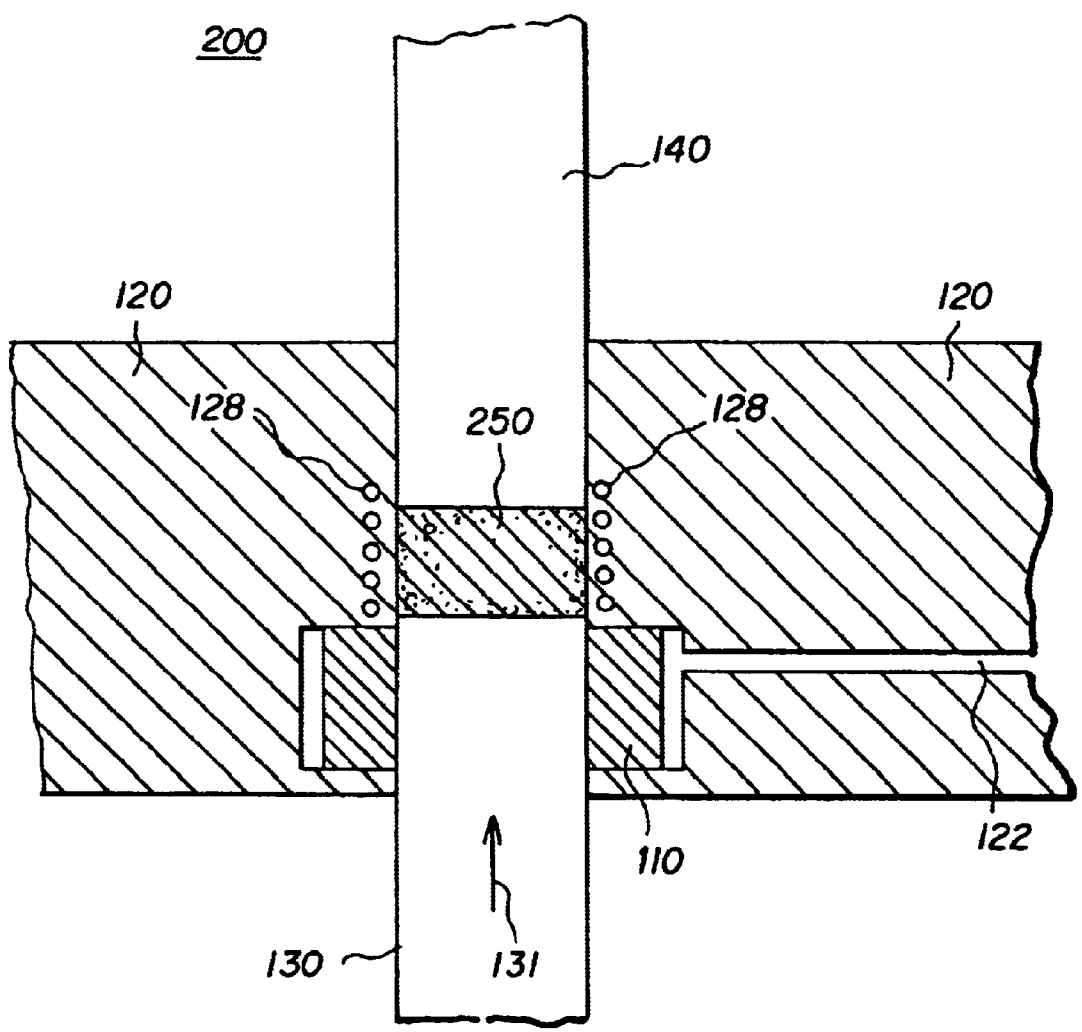
FIG. 5 is a cross-sectional view of the completion sequence of the process step depicted in FIG. 4.

Turning to FIG. 5 now, there is shown schematically the final step of the compaction arrangement 200, wherein the solid organic pellet 250 has just been formed using an alternative embodiment of the invention. The die 120 is allowed to cool to the ambient temperature and then the organic pellet 250 is removed from the die cavity by pushing the second punch 130 in a second direction 131 until the solid organic pellet 250 is out of the die 120. The solid organic pellet 250 is then stored in a moisture-free, preferably vacuum, container until further use.

Figure 6:
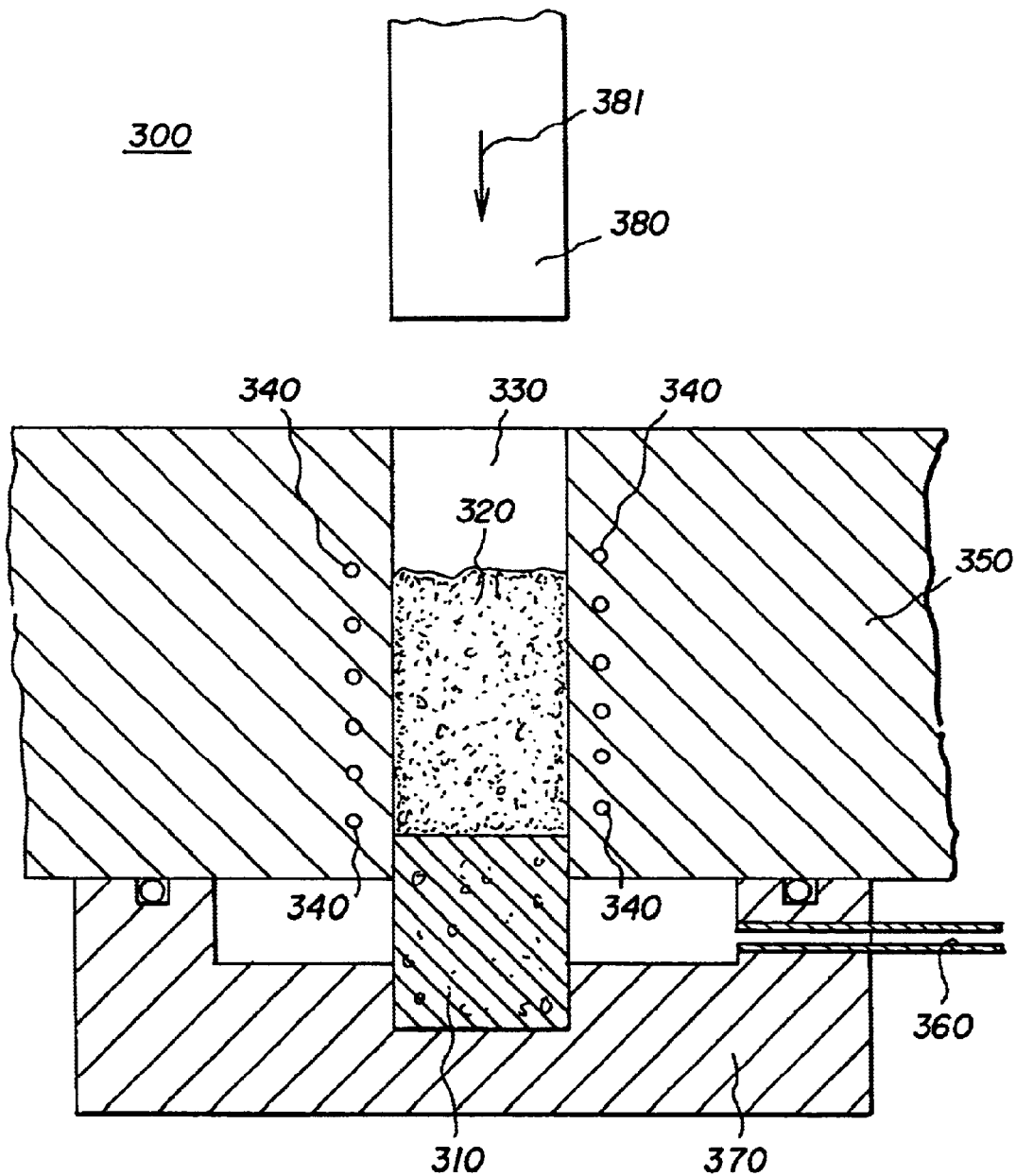
FIG. 6 is a cross-sectional view of another alternative embodiment of the process step of the invention.

Yet, another alternative embodiment of the invention is shown in FIG. 6, which shows a schematic of compaction arrangement 300, wherein a stream of dry nitrogen or dry argon is passed through a porous second (lower) punch 310. A measured amount of organic powder 320 is placed inside the die cavity 330 over the porous second punch 310 and the heating coil 340 embedded inside the die 350 is energized to raise the temperature of the organic powder 320 to a predetermined level. A stream of dry nitrogen or dry argon gas is passed through an inlet 360 which is attached to the second (lower) punch housing 370. When the temperature of the organic powder 320 has reached the predetermined point and enough time has elapsed so that the dry nitrogen or dry argon has necessarily removed all the adsorbed moisture from the organic powder 320, a first (top) punch 380 is plunged inside the die cavity 330 over the organic powder 320 in a first direction 381 and a known amount of pressure is applied. Pre-heated dry nitrogen or dry argon can also be used alternatively to aid in removing the adsorbed moisture at a faster rate.

Figure 7:
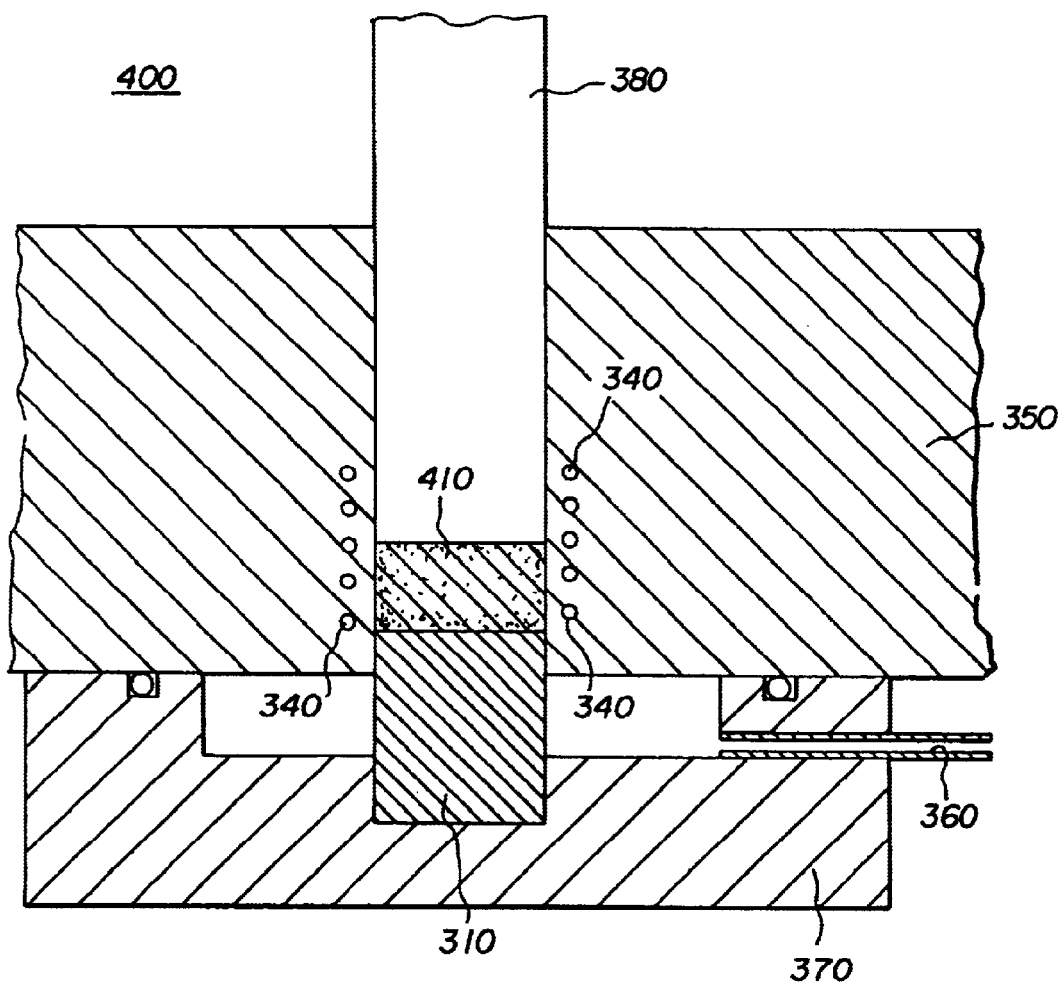
FIG. 7 is a cross-sectional view of the completion sequence of the embodiment of the invention depicted in FIG. 6.

Now, turning to FIG. 7, there is shown the final sequence 400 of the compaction arrangement as shown in FIG. 6, wherein a compacted solid organic pellet 410 is formed. The die 350 is then allowed to cool to room temperature and the organic pellet 410 is removed from the die cavity and stored in a moisture-free, preferably vacuum, container as described hereinbefore.

WORKING EXAMPLES

The invention and its advantages over the prior art are further illustrated by the specific working examples that follow.

Figure 8:
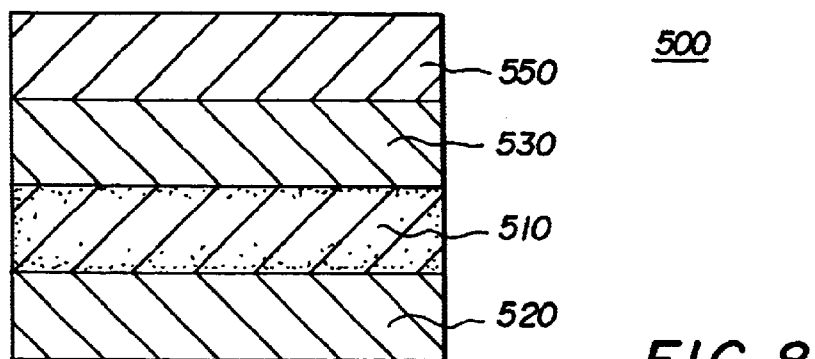
FIG. 8 depicts schematic of an OLED formed using organic pellets made according to the invention.

FIG. 8 shows a schematic cross-sectional view of an OLED 500 including an emission layer (EML) 510 situated between a hole-transport layer (HTL) 520 and an electron transport layer (ETL) 530. Each of these organic layers was made from organic pellets made according to the invention, similar to the organic pellet 52 as shown in FIG. 2, wherein desiccant calcium oxide was used as a moisture scavenger from the organic powder 24 (FIG. 1). The two transport layers, HTL 520 and ETL 530 deliver holes from an anode 540 and electrons from a cathode 550, respectively, to the emission layer EML 510. A glass substrate 560 provides mechanical support for the OLED 500 and for electrical leads connecting the OLED 500 to a source of electrical current. The anode 540 in this example is indium-tin-oxide (ITO), which is transparent to the electroluminescent light, and the cathode 550 is Mg-Ag alloy. The glass substrates 560 coated with an 80 nm layer of ITO for use as an anode 540 were sequentially ultrasonicated in a commercial detergent, rinsed in deionized water, and degreased in toluene vapor. The ITO layer was treated with oxygen plasma for about one minute and then transferred to a vacuum chamber. A 75 nm HTL 520 was deposited from an organic pellet including NPB, and a 37.5 nm ETL was deposited from an organic pellet comprising undoped Alq, and a 200 nm cathode 550 was deposited from a Mg-Ag alloy (in the ratio 90:10). A 37.5 nm EML 510 was deposited from an organic pellet including a host and dopants to produce green, red or blue emission. A control OLED was also constructed wherein a 37.5 nm EML was deposited from undoped Alq powder, as in prior art, for the purpose of comparison. The freshly constructed OLEDs were transferred to a glove box filled with dry nitrogen, where they were encapsulated along with a desiccant for protection against the ambient environment.

The ITO coating on the glass substrates was patterned so that several OLEDs were produced on one substrate. The EL characteristics of one of these OLEDs were evaluated using a constant-current source and a photometer. The initial luminance efficiency, CIE coordinates, and driving voltage, all were measured at a current density of 20 mA/cm$^2$. Similarly, the operational stability of this OLED was evaluated by operating it at a constant current density of 20 mA/cm$^2$ while monitoring its luminance and driving voltage. The EL characteristics and operational stability of additional OLEDs described below for specific devices constructed according to the invention were evaluated at the same current density and in the same manner as in this Example.

Example 1

A plurality of green OLEDs were constructed as described hereinabove using an organic pellet to deposit 37.5 nm EMLs comprising a mixture of 1:1 ratio of Alq and TBADN and 0.5% by weight of CFDMQA as a dopant. A single control OLED was also constructed under identical conditions wherein the EML was deposited from undoped Alq powder.

Green OLEDs #A1, A2, A3, A4, and A5 were made according to the invention using CaO desiccant as a scavenger for moisture during the compaction process (FIG. 2), and that was compared with devices #B1, B2, and B3, which were made using an organic pellet that was compacted in absence of CaO desiccant. Also a control green OLED, C1, was made wherein the EML was deposited from undoped Alq powder. All the devices were made under identical conditions, and they were tested for EL using the same analytical tools and procedures. Test results are summarized in Table 1 below, which reflect a substantial improvement in performance for the devices made according to the invention:

TABLE 1

EL performance data of green OLEDs made according to the invention and compared with those made according to prior art.

| Device # | Compacting condition | Drive Voltage (V) | Luminance Yield (cd/A) | EL Peak Position (nm) | CIEx | CIEy | Luminance @ 20 cd/m$^2$ |
|---|---|---|---|---|---|---|---|
| A1 | With CaO | 9.6 | 3.71 | 532 | 0.37 | 0.57 | 742 |
| A2 | With CaO | 9.8 | 3.50 | 528 | 0.37 | 0.57 | 700 |
| A3 | With CaO | 9.8 | 3.50 | 528 | 0.37 | 0.57 | 700 |
| A4 | With CaO | 7.8 | 3.40 | 524 | 0.33 | 0.56 | 680 |

TABLE 1-continued

EL performance data of green OLEDs made according to the
invention and compared with those made according to prior art.

| Device # | Compacting condition | Drive Voltage (V) | Luminance Yield (cd/A) | EL Peak Position (nm) | CIEx | CIEy | Luminance @ 20 cd/m$^2$ |
|---|---|---|---|---|---|---|---|
| A5 | With CaO | 7.7 | 3.30 | 524 | 0.33 | 0.56 | 660 |
| B1 | Without CaO | 9.3 | 3.03 | 528 | 0.38 | 0.57 | 606 |
| B2 | Without CaO | 9.3 | 3.05 | 528 | 0.38 | 0.57 | 610 |
| C1 | Control | 7.9 | 2.95 | 524 | 0.34 | 0.55 | 590 |

Example 2

A plurality of red OLEDs were constructed as described hereinabove using an organic pellet to deposit 37.5 nm EMLs comprising a mixture of 1:1 ratio of Alq and TBADN and 1.75% by weight of DCJTB and 5% by weight of Rubrene as dopants. A single control OLED was also constructed under identical conditions wherein the EML was deposited from undoped Alq powder.

Red devices #D1, D2, D3, D4 and D5 were made according to the invention using CaO desiccant as a scavenger for moisture during the compaction process (FIG. 2), and that was compared with red devices #E1 and E2, which were made from organic pellets compacted in absence of CaO desiccant. Also a control green OLED, C2, was made wherein the EML was deposited from undoped Alq powder. All the devices were made under identical conditions, and they were tested for EL using the same analytical tools and procedures. Test results are summarized in Table 2 below, which reflect again a substantial improvement in performance for the devices made according to the invention:

TABLE 2

EL performance data of red OLEDs made according to the
invention and compared with those made according to prior art.

| Device # | Compacting condition | Drive Voltage (V) | Luminance Yield (cd/A) | EL Peak Position (nm) | CIEx | CIEy | Luminance @ 20 cd/m$^2$ |
|---|---|---|---|---|---|---|---|
| D1 | With CaO | 10.8 | 4.10 | 616 | 0.624 | 0.377 | 820 |
| D2 | With CaO | 10.9 | 3.60 | 616 | 0.625 | 0.372 | 720 |
| D3 | With CaO | 10.7 | 3.90 | 616 | 0.621 | 0.372 | 780 |
| D4 | With CaO | 10.9 | 3.60 | 616 | 0.625 | 0.372 | 720 |
| D5 | With CaO | 10.9 | 3.80 | 616 | 0.623 | 0.372 | 760 |
| E1 | Without CaO | 10.7 | 3.10 | 616 | 0.629 | 0.370 | 620 |
| E2 | Without CaO | 11.9 | 3.06 | 624 | 0.635 | 0.362 | 612 |
| C2 | Control | 8.3 | 3.00 | 528 | 0.344 | 0.548 | 600 |

Example #3

Figure 9:
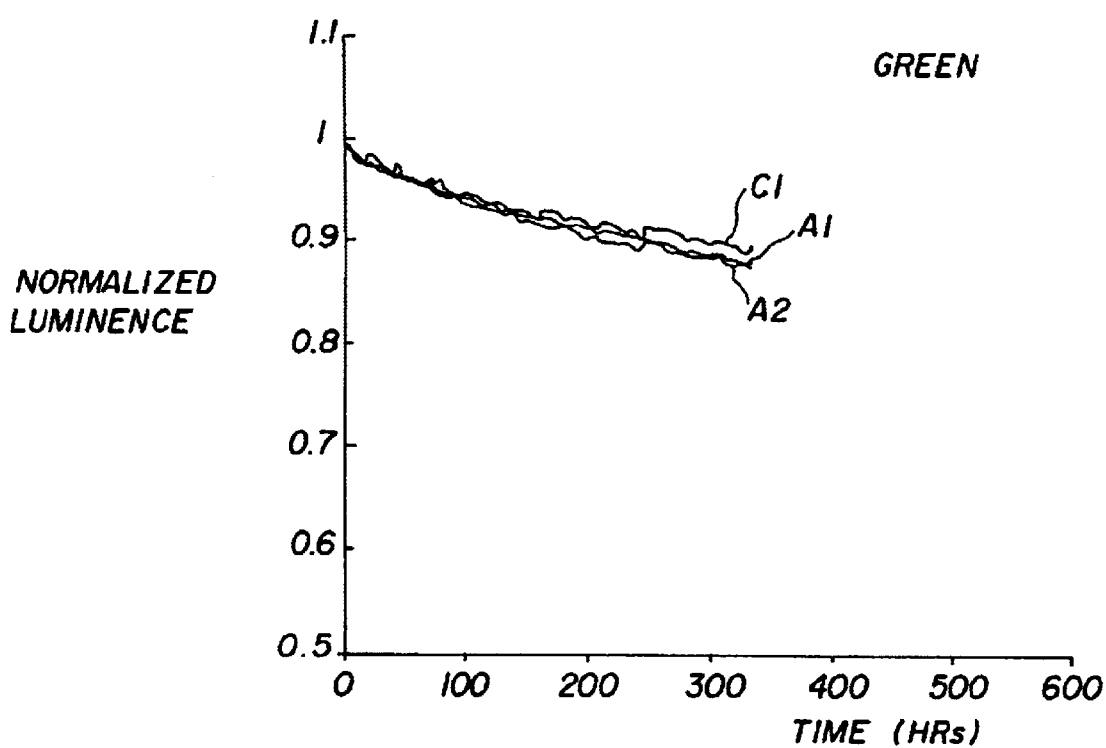
FIG. 9 is graphical plot of green OLEDs showing EL performance with respect to time.

FIG. 9 shows results of fade tests of the green devices #A1 and A2 and compared to that of the control green device #C1 wherein normalized luminescence is plotted against time. The plot strongly indicates that the stability of OLEDs made using solid organic pellets compacted according to the invention are as stable as the control.

The solid organic pellets can be formed into a shape selected to conform to a shape of a physical vapor deposition source from which a portion of a pellet is evaporated to form an organic layer on a substrate.

The invention has been described in detail with particular reference to certain preferred embodiments thereof, but it will be understood that variations and modifications can be effected within the spirit and scope of the invention.

PARTS LIST 10 compaction arrangement
20 porous desiccant bed
22 second (lower) punch
24 organic powder
28 first (upper) punch
29 first direction
30 die cavity
31 second direction
32 die
33 heating coil
34 moisture escape arrow
50 compaction arrangement
52 solid organic pellet
54 first porous desiccant bed
56 solid organic pellet
58 second porous desiccant bed
60 porous paper
62 porous paper
64 porous paper
66 solid organic pellet 68 porous desiccant bed
70 porous desiccant bed
100 compaction arrangement
110 porous receptor
120 die
122 gas inlet
124 die cavity
126 organic powder
128 heating coil Parts List cont'd 130 second (lower) punch
131 second direction
132 opening
140 first (upper) punch 141 first direction
200 compaction arrangement
250 solid organic pellet
300 compaction arrangement
310 porous second (lower) punch
320 organic powder
330 die cavity
340 heating coil
350 die
360 gas inlet
370 second (lower) punch housing
380 first (top) punch
381 first direction
400 compaction arrangement
410 solid organic pellet
500 OLED
510 emission layer (EML)
520 hole-transport layer (HTL)
530 electron-transport layer (ETL)
540 anode
550 cathode
560 substrate

What is claimed is:

1. A method of compacting moisture-sensitive organic material adaptable for making an organic layer on a structure which will form part of an organic light-emitting device, comprising the steps of:
    (a) placing such a desiccant material in a powder form inside a die cavity and applying a pressure to such a desiccant powder in the die cavity sufficient to compact into a porous desiccant bed;
    (b) providing moisture-sensitive organic material in a powder form; and
    (c) placing such moisture-sensitive organic material inside the die cavity over the porous desiccant bed, and applying sufficient heat to the moisture-sensitive organic material in the die cavity to cause moisture to escape from the moisture-sensitive organic material and be absorbed by the porous desiccant bed, and then applying sufficient pressure to compact the moisture-sensitive organic material into a solid organic pellet.

2. The method of claim 1 further including the steps of separating the solid organic pellet from the porous desiccant bed and storing the moisture-free solid organic pellet inside a vacuum container until further use.

3. The method of claim 1 wherein a first punch is used inside the die cavity and is movable in a first direction to form the solid organic pellet.

4. The method of claim 3 wherein a second punch is used inside the die cavity and is movable in a second and opposite direction to the first direction to remove the porous desiccant bed and the solid organic pellet from the die cavity and then separating the porous desiccant bed from the solid organic pellet.

5. The method of claim 1 wherein the desiccant material includes alkaline earth oxides.

6. The method of claim 1 wherein the porosity of the porous desiccant bed range from 40 to 80%.

7. The method of claim 1 wherein the moisture sensitive organic material includes a mixture of a plurality of different organic or organo-metallic molecules.

8. The method of claim 7 wherein the moisture sensitive organic material is heated below the lowest Tg of the different molecules.

9. The method of claim 1 wherein the moisture sensitive organic material is heated below its Tg.

10. The method of claim 1 wherein the solid organic pellets are used in a vapor deposition source in forming an OLED device.

11. A method of compacting moisture-sensitive organic material adaptable for making an organic layer on a structure which will form part of an organic light-emitting device, comprising the steps of:
    (a) providing a desiccant material in a powder form;
    (b) placing a first load of desiccant powder inside a die cavity over a second punch and moving a first punch to apply pressure to such desiccant powder in the die cavity to compact into a first porous desiccant bed;
    (c) placing moisture-sensitive organic material in a powder form inside the die cavity over the first porous desiccant bed, and applying sufficient pressure with the first punch to level the top surface of the moisture-sensitive organic material;
    (d) placing a second load of desiccant powder over the level surface of moisture-sensitive organic material and apply sufficient pressure with the first punch to form a second porous desiccant bed; and
    (e) applying sufficient heat to the moisture-sensitive organic material inside the die cavity to cause moisture to escape from the moisture-sensitive organic material and be absorbed by the first and second porous desiccant beds, and then applying sufficient pressure to compact the moisture-sensitive organic material into a solid organic pellet.

12. The method of claim 11 further including the steps of separating the solid organic pellet from the porous desiccant bed and storing the moisture-free solid organic pellet inside a vacuum container until further use.

13. The method of claim 12 wherein the second punch is movable in a second and opposite direction to the first direction to remove the first and second porous desiccant beds and the solid organic pellet from the die cavity and then separating the first and second porous desiccant beds from the solid organic pellet.

14. A method of claim 11 wherein the first punch is used inside the die cavity and is movable in the first direction to form the solid organic pellet.

15. The method of claim 12 wherein the second punch is used inside the die cavity and is movable in the second and opposite direction to the first direction to remove the first and second porous desiccant beds and the solid organic pellet from the die cavity and then separating the porous desiccant beds from the solid organic pellet.

16. The method of claim 111 wherein the desiccant material includes alkaline earth oxides.

17. The method of claim 11 wherein the porosity of the porous desiccant beds range from 40 to 80%.

18. The method of claim 11 wherein the organic material includes a mixture of a plurality of different organic or organo-metallic molecules.

19. The method of claim 18 wherein the moisture sensitive organic material is heated below the lowest Tg of the different molecules.

20. The method of claim 11 wherein the moisture sensitive organic material is heated below its Tg.

21. The method of claim 11 wherein the solid organic pellets are used in a vapor deposition source in forming an OLED device.

22. A method of compacting moisture-sensitive organic material adaptable for making an organic layer on a structure which will form part of an organic light-emitting device, comprising the steps of:
    (a) placing such a moisture-sensitive organic material in a powder form inside a die cavity; and
    (b) applying sufficient heat to the moisture-sensitive organic material in the die cavity and passing a stream of dry inert gas through the moisture-sensitive organic material to cause moisture to escape from the moisture-sensitive organic material and be carried away by the inert gas, and then applying sufficient pressure to compact the moisture-sensitive organic material into a solid organic pellet.

23. The method of claim 22 further including the step of removing the solid organic pellet from the die cavity.

24. The method of claim 22 wherein the organic material includes a mixture of a plurality of different of organic or organo-metallic molecules.

25. The method of claim 24 wherein the moisture sensitive organic material is heated below the lowest $T_g$ of the different molecules.

26. The method of claim 22 wherein the moisture sensitive organic material is heated below its $T_g$.

27. The method of claim 22 wherein the solid organic pellets are used in a vapor deposition source in forming an OLED display.

* * * * *